(12) United States Patent
Kim et al.

(10) Patent No.: US 9,124,280 B2
(45) Date of Patent: Sep. 1, 2015

(54) TIME TO DIGITAL CONVERTER

(71) Applicant: Industry-Academic Cooperation Foundation, Yonsei University, Seoul (KR)

(72) Inventors: Yeomyung Kim, Seoul (KR); Tae Wook Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/305,243

(22) Filed: Jun. 16, 2014

(65) Prior Publication Data
US 2014/0368372 A1    Dec. 18, 2014

(30) Foreign Application Priority Data

Jun. 14, 2013 (KR) .......................... 10-2013-0068488

(51) Int. Cl.
| H03M 1/50 | (2006.01) |
| H03M 1/00 | (2006.01) |
| G04F 10/00 | (2006.01) |

(52) U.S. Cl.
CPC .............. *H03M 1/002* (2013.01); *G04F 10/005* (2013.01)

(58) Field of Classification Search
CPC ............................ H03M 1/002; G04F 10/005
USPC ........... 341/155, 166, 169, 154; 327/105, 262
See application file for complete search history.

(56) References Cited

U.S. PATENT DOCUMENTS

| 6,501,706 | B1 | 12/2002 | West |
| 7,872,602 | B2 * | 1/2011 | Chen .............................. 341/166 |
| 7,888,973 | B1 | 2/2011 | Rezzi et al. |
| 8,138,958 | B2 * | 3/2012 | Dai et al. ....................... 341/155 |
| 8,193,963 | B2 * | 6/2012 | Wang et al. .................... 341/166 |
| 8,564,471 | B1 * | 10/2013 | Gao et al. ....................... 341/166 |

FOREIGN PATENT DOCUMENTS

| KR | 10-2011-0113790 A | 10/2011 |
| KR | 10-2012-0011957 A | 2/2012 |
| KR | 10-2012-0113546 A | 10/2012 |
| WO | 2010/104164 A1 | 9/2010 |

OTHER PUBLICATIONS

Luca Vercesi, et al., "Two-Dimensions Vernier Time-to-Digital Converter", IEEE Journal of Solid-State Circuits, vol. 45, No. 8, Aug. 2010, pp. 1504-1512.

* cited by examiner

*Primary Examiner* — Brian Young
(74) *Attorney, Agent, or Firm* — Carter, DeLuca, Farrell & Schmidt, LLP

(57) ABSTRACT

A time to digital converter includes: a first measurement unit measuring a time difference between a start signal and a stop signal as a first time unit by using a first delay line; a second measurement unit measuring a time difference between the stop signal and the start signal delayed by the first delay line as a second time unit by using a second delay line and a third delay line and comparing an output signal of one delay cell included in the second delay line with an output signal of at least two delay cells included in the third delay line; and an output unit outputting a final time difference between the start signal and the stop signal as a digital code on the basis of measurement results of the first measurement unit and the second measurement unit.

26 Claims, 13 Drawing Sheets

TIME TO DIGITAL CONVERTER

CROSS-REFERENCE TO RELATED APPLICATIONS

This U.S. non-provisional patent application claims priority under 35 U.S.C. §119 of Korean Patent Application No. 10-2013-0068488, filed on Jun. 14, 2013, the entire contents of which are hereby incorporated by reference.

BACKGROUND OF THE INVENTION

The present invention disclosed herein relates to a time to digital converter.

A time to digital converter (TDC) is a circuit block converting time information into digital code. Once a start signal and a stop signal are inputted to a TDC, the TDC measures a time difference between the start signal and the stop signal and outputs it as digital code.

A typical TDC uses a delay line configured with a plurality of delay cells. Such a TDC compares the order of a stop signal and an application time as delaying a start signal by a predetermined time through the delay line. When the delayed start signal is applied later than the stop signal, the delay time of a corresponding start signal becomes a time difference between the start signal and the stop signal and a TDC outputs a digital code corresponding to the delay time.

In relation to a typical TDC, the number of delay cells configuring a delay line is increased in proportional to the number of bits in a digital code. As a result, a time difference between two signals to be converted becomes longer. Moreover, when a time difference is converted into a high resolution, since the number of output bits of a TDC becomes greater, hardware that the TDC requires is required more and also a chip area and power consumption are increased.

SUMMARY OF THE INVENTION

The present invention provides a TDC for obtaining the more number of output bits with less hardware.

The present invention provides a TDC having a minimized chip area and improved power consumption with the increased number of output bits.

Embodiments of the present invention provide time to digital converters include: a first measurement unit measuring a time difference between a start signal and a stop signal by a first time unit by using a first delay line; a second measurement unit measuring a time difference between the stop signal and the start signal delayed by the first delay line by a second time unit by using a second delay line and a third delay line and comparing an output signal of one delay cell included in the second delay line with an output signal of at least two delay cells included in the third delay line; and an output unit outputting a final time difference between the start signal and the stop signal as a digital code on the basis of measurement results of the first measurement unit and the second measurement unit In some embodiments, the first measurement unit includes: a first delay line receiving the start signal and including a plurality of cascaded delay cells delaying an input signal by the first time unit; a plurality of time comparators outputting a digital signal by comparing an application time of the start signal delayed by the delay cell of the first delay line with an application time of the stop signal; and a multiplexer selecting one of start signals delayed by the plurality of delay cells according to a digital signal outputted from the time comparator.

In other embodiments, the time comparator may output a digital signal having a logic level of 1 when the start signal delayed by the delay cell is received before the stop signal and may output a digital signal having a logic level of 0 when the start signal delayed by the delay cell is received after the stop signal.

In still other embodiments, the time comparator may be a D flip-flop receiving the start signal delayed by the delay cell as data and receiving the stop signal as a clock.

In even other embodiments, the multiplexer may select a signal applied first from delayed start signals received by a time comparator outputting a digital signal having a logic level of 0 and then may provide the selected signal to the second measurement unit.

In yet other embodiments, the multiplexer may include a plurality of AND gates receiving an output signal of a delay cell, an inverted signal of an output signal of a time comparator receiving an output signal of a corresponding delay cell, and an output signal of a previous time comparator disposed at the front end of a corresponding time comparator and performing an AND operation on the received signals.

In further embodiments, the second measurement unit may include: a second delay line receiving the start signal delayed by the first delay line and including a plurality of cascaded delay cells delaying an input signal by a second delay time; a third delay line receiving the stop signal and including a plurality of cascaded delay cells delaying an input signal by a third delay time; and a plurality of time comparators outputting a digital signal by comparing an application time of a start signal delayed by a delay cell of the second delay line with an application time of a stop signal delayed by a delay cell of the third delay line.

In still further embodiments, the second time unit may be a time difference between the third delay time and the second delay time.

In even further embodiments, the first time unit may be greater than the second time unit.

In yet further embodiments, the plurality of time comparators may be configured to compare one delayed start signal outputted from the second delay line with a plurality of delayed stop signals outputted from the third delay line.

In yet further embodiments, the time comparator may output a digital signal having a logic level of 1 when the stop signal delayed by the delay cell of the third delay line is received before the start signal delayed by the delay cell of the second delay line and may output a digital signal having a logic level of 0 when the stop signal delayed by the delay cell of the third delay line is received after the start signal delayed by the delay cell of the second delay line.

In yet further embodiments, the time comparator may be a D flip-flop receiving the stop signal delayed by the delay cell of the third delay line as data and receiving the start signal delayed by the delay cell of the second delay line as a clock.

In yet further embodiments, the delay cell may include: a first sub delay cell delaying the start signal by a portion of the first time unit; and a second sub delay cell delaying a start signal delayed by the first sub delay cell by the remaining of the first time unit.

In yet further embodiments, the multiplexer may include a plurality of AND gates receiving an output signal of a first sub delay cell, an inverted signal of an output signal of a time comparator receiving a start signal inputted to a corresponding first sub delay cell, and an output signal of a previous time comparator disposed at the front end of a corresponding time comparator and performing an AND operation on the received signals.

In yet further embodiments, the output unit may include a calculation unit subtracting a time difference between a stop signal measured by the second measurement unit and a start signal delayed by a first delay line from a time difference between a start signal and a stop signal measured by the first measurement unit to calculate the final time difference.

In other embodiments of the present invention, time to digital converters include: a first delay line including a plurality of cascaded first delay cells, receiving a start signal, and delaying the start signal by a first delay time and outputting the delayed signal each time the start signal passes through the first delay cell; a plurality of first time comparators receiving an output signal and a stop signal of the first delay and comparing application times of the two signals; a multiplexer selecting a signal whose application time is later than that of the stop signal and having the smallest time difference with the stop signal from output signals of the plurality of first delay cells by using an output signal of the first time comparator; a second delay line including a plurality of cascaded second delay cells, receiving the signal selected by the multiplexer, and delaying the signal selected by the multiplexer by a second delay time and outputting the delayed signal each time the signal selected by the multiplexer passes through the second delay cell; a third delay line including a plurality of cascaded third delay cells, receiving the stop signal, and delaying the stop signal by a third delay time and outputting the delayed signal each time the stop signal passes through the third delay cell; and a plurality of second time comparators receiving an output signal of the second delay cell and an output signal of the third delay cell and comparing application times of the two signals, wherein an output signal of one second delay cell included in the second delay line is compared with an output signal of at least two third delay cells included in the third delay line.

In some embodiments, the first time comparator may be a D flip-flop receiving an output signal of the first delay cell as data and receives the stop signal as a clock; outputting a digital signal having a logic level of 1 when the output signal of the first delay cell is received before the stop signal; and outputting a digital signal having a logic level of 0 when the output signal of the first delay cell is received after the stop signal.

In other embodiments, the multiplexer may include a plurality of AND gates receiving an output signal of a first delay cell, an inverted signal of an output signal of a first time comparator receiving an output signal of a corresponding first delay cell, and an output signal of a previous first time comparator disposed at the front end of a corresponding first time comparator and performing an AND operation on the received signals.

In still other embodiments, the second time comparator may be a D flip-flop receiving an output signal of the third delay cell as data and receiving an output signal of the second delay cell as a clock; outputting a digital signal having a logic level of 1 when the output signal of the third delay cell is received before the output signal of the second delay cell; and outputting a digital signal having a logic level of 0 when the output signal of the third delay cell is received after the output signal of the second delay cell.

In even other embodiments, the first delay cell may include: a first sub delay cell delaying the start signal by the half of the first delay time; and a second sub delay cell further delaying the start signal delayed by the first sub delay cell by the half of the first delay time.

In yet other embodiments, the multiplexer may include a plurality of AND gates receiving an output signal of a first sub delay cell, an inverted signal of an output signal of a first time comparator receiving a start signal inputted to a corresponding first sub delay cell, and an output signal of a previous first time comparator disposed at the front end of a corresponding first time comparator and performing an AND operation on the received signals.

In further embodiments, the converter may further include an output unit outputting a time difference between the start signal and the stop signal as a digital code on the basis of output signals of the first time comparator and the second time comparator.

In still further embodiments, the output unit may include an encoder converting a thermometer code into a binary code.

In still other embodiments of the present invention, time to digital converters include: a clock count measurement unit measuring the number of clocks between a start signal and a stop signal; an interface unit outputting a delay signal by delaying the stop signal; a conversion unit measuring a time difference between the stop signal and the delay signal and converting the measured time difference into a digital code; and a output logic unit outputting the time difference between the start signal and the stop signal as a digital code on the basis of the number of counts and the time difference, wherein the conversion unit includes: a first measurement unit measuring the time difference between the start signal and the stop signal by a first time unit by using a first delay line; a second measurement unit measuring a time difference between the delay signal and a stop signal delayed by the first delay line by a second time unit by using a second delay line and a third delay line, wherein one delay cell included in the second delay line matches at least two delay cells included in the third delay line; and an output unit outputting a final time difference between the stop signal and the delay signal as a digital code on the basis of measurement results of the first measurement unit and the second measurement unit.

In some embodiments, the clock count measurement unit may include: an AND gate generating an enable signal by performing an AND operation on the start signal and an inverted signal of the stop signal; and a counter receiving the enable signal and the clock signal and counting the number of clocks inputted while the enable signal is applied.

In other embodiments, the interface unit may include a first D flip-flop receiving the stop signal as data and receiving a clock signal as a clock and a second D flip-flop receiving an output signal of the first D flip-flop as data and receiving the clock signal as a clock to output the delay signal.

In still other embodiments, the output logic unit may add a bit corresponding to the number of D flip-flops included in the interface unit to a bit corresponding to the number of clocks and may subtract a bit corresponding to a time difference between the stop signal and the delay signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The effects and features of the present invention and methods of achieving them will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Otherwise indicated herein, all the terms used herein, which include technical or scientific terms, may have the same meaning that is generally understood by a person skilled in the art. Terms defined by general dictionaries are interpreted as having the same meanings as that in related techniques and/or this specification and if not clearly defined, are not conceptualized or not be interpreted as being overly excessive.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. As used herein, the term and/or includes any and all combinations of one or more of the associated listed items.

An embodiment of the present invention includes two measurement units for converting a time difference between two signals as different time units to configure a time to digital converter (TDC). Then, one of the two measurement units may configure a one-dimensional TDC by using one delay line and the other one may configure two-dimensional TDC by using two delay lines.

Hereinafter referred to as embodiments of the present invention will be described in more detail with reference to the accompanying drawings.

Figure 1:
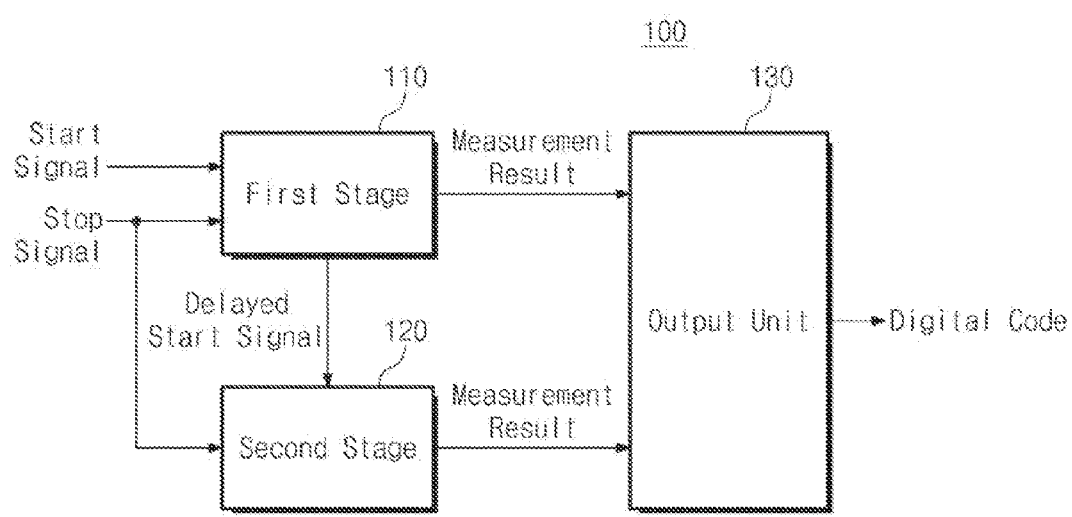
FIG. 1 is a block diagram illustrating a TDC according to an embodiment of the present invention.

FIG. 1 is a block diagram illustrating a TDC according to an embodiment of the present invention.

As shown in FIG. 1, the TDC 100 includes a first measurement unit 110 and a second measurement unit 120. The first measurement unit 110 may measure a time difference between a start signal and a stop signal by a first time unit. The second measurement unit 120 may measure a time difference between a stop signal and a delayed start signal by a second time unit.

According to an embodiment of the present invention, The TDC 100 may further include an output unit 130. The output unit 130 may output a final time difference between a start signal and a stop signal as a digital code on the basis of a measurement result of the first measurement unit 110 and the second measurement unit 120.

Figure 2:
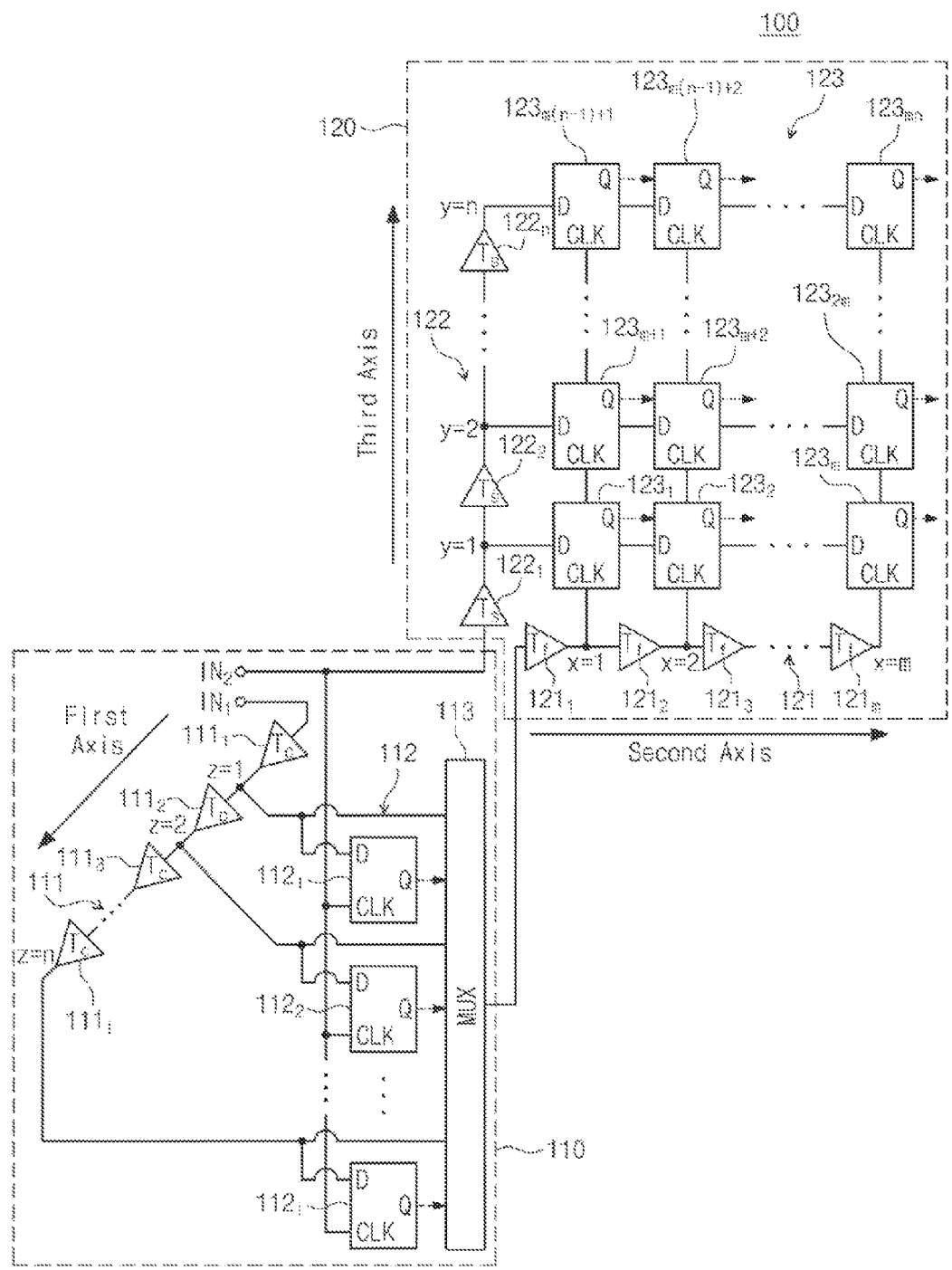
FIG. 2 is a circuit diagram illustrating a TDC according to an embodiment of the present invention.

FIG. 2 is a circuit diagram illustrating a TDC according to an embodiment of the present invention.

As shown in FIG. 2, the TDC 100 includes a first measurement unit 110 and a second measurement unit 120. The first measurement unit 110 may measure a time difference between a start signal $IN_1$ and a stop signal $IN_2$ as a first time unit through a first delay line 111. The second measurement unit 120 may measure a time difference between a stop signal $IN_2$ and a start signal delayed by the first delay line 111 as a second time unit through a second delay line 121 and a third delay line 122.

According to an embodiment of the present invention, the first measurement unit 110 includes the first delay line 111 including a plurality of delay cells $111_1$ to $111_I$ delaying the start signal $IN_1$ by a first time unit $T_c$, a plurality of time comparators $112_1$ to $112_I$ outputting a digital signal by comparing an application time of a start signal delayed by the delay cells $111_1$ to $111_I$ of the first delay line 111 with an application time of the stop signal $IN_2$, and a multiplexer selecting one of start signals delayed by the delay cells $111_1$ to $111_I$ according to a digital signal outputted from the time comparator.

As shown in FIG. 2, the first delay line 111 may be configured with a plurality of cascaded delay cells (hereinafter referred to as first delay cells) $111_1$ to $111_I$ delaying the start signal $IN_1$ by the first delay time $T_c$. As a result, each time the start signal $IN_1$ inputted to the first delay line 111 passes through the first delay cell, the application time may be delayed by the first delay time $T_c$.

For example, the application time of a start signal passing through the first delay cell 111 may be delayed by $T_c$ than that of an inputted start signal and the application time of a start signal passing through the second first delay cell $111_2$ may be delayed by $2T_c$ than that of an inputted start signal.

The time comparators (hereinafter referred to as first time comparators) $112_1$ to $112_I$ may output a digital signal by comparing the application time of a start signal delayed by the first delay cells $111_1$ to $111_I$ with the application time of the stop signal $IN_2$.

According to an embodiment of the present invention, when a start signal delayed by the first delay cells $111_1$ to $111_I$ is inputted before a stop signal, the first time comparators $112_1$ to $112_I$ may output a digital signal whose logic level is 1, and when a start signal delayed by the first delay cells $111_1$ to $111_I$ is inputted after a stop signal, the first time comparators $112_1$ to $112_I$ may output a digital signal whose logic level is 0.

For example, as shown in FIG. 2, the first time comparators $112_1$ to $112_I$ may be D flip-flops receiving a start signal delayed by the first delay cell as data D and receiving a stop signal as a clock Clk.

The first time comparators $112_1$ to $112_I$ shown in FIG. 2 may be configured to output a digital signal whose logic level is 1 when a delayed start signal is applied before a stop signal and output a digital signal whose logic level is 0 when a delayed start signal is applied after a stop signal. However, according to an embodiment of the present invention, the first time comparators $112_1$ to $112_I$ may be configured to output a digital signal whose logic level is 0 when a delayed start signal is applied before a stop signal and output a digital signal whose logic level is 1 when a delayed start signal is applied after a stop signal.

According to an embodiment of the present invention, first time comparators may correspond to first delay cells respectively.

For example, as shown in FIG. 2, the first first time comparator $112_1$ may receive an output signal of the first first delay cell $111_1$ and then may compare the output signal with a stop signal; the second first time comparator $112_2$ may receive an output signal of the second first delay cell $111_2$ and then may compare the output signal with a stop signal; and the Ith first time comparator $112_I$ may receive an output signal of the Ith first delay cell $111_I$ and then may compare the output signal with a stop signal.

The multiplexer 113 may select one of start signals delayed by the plurality of first delay cells $111_1$ to $111_I$ according to digital signals outputted from the first time comparators $112_1$ to $112_I$.

According to an embodiment of the present invention, the multiplexer 113 may select a signal applied first among delayed start signals received by a time comparator outputting a digital signal whose logic level is 0.

For example, according to the embodiment of FIG. 2, when a start signal delayed by the second first delay cell $111_2$ is applied after the stop signal, the first first time comparator $112_1$ outputs a digital signal whose logic level is 1. The second to Ith first time comparators $112_2$ to $112_I$ may output a digital signal whose logic level is 0. In this case, the multiplexer 113 may select a signal applied first among signals received by the second to Ith first time comparators $112_2$ to $112_I$, that is, a signal outputted from the second first delay cell $111_2$, and then may provide the selected signal to the second measurement unit 120.

Figure 3:
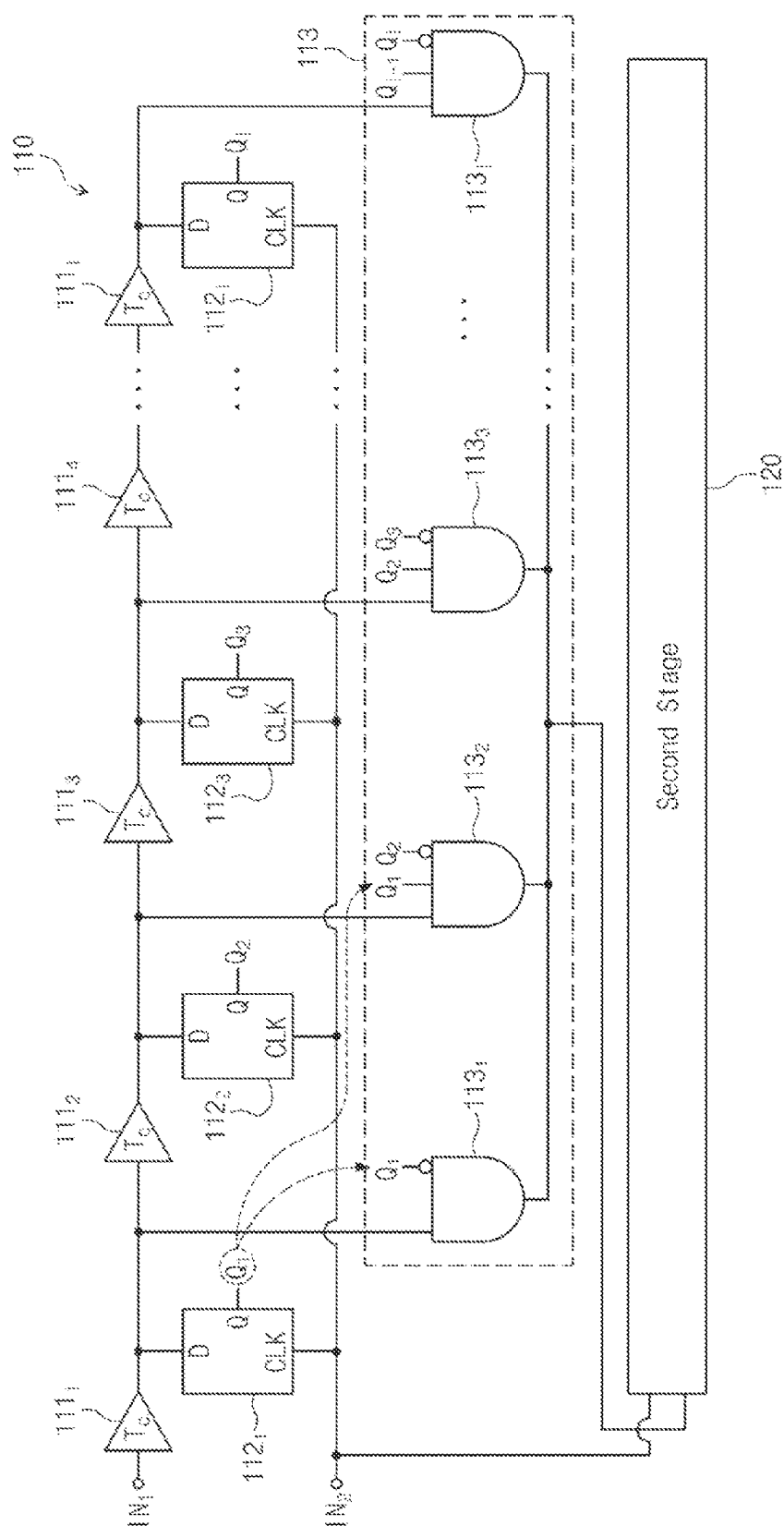
FIG. 3 is a circuit diagram illustrating a multiplexer according to an embodiment of the present invention.

FIG. 3 is a circuit diagram illustrating a multiplexer according to an embodiment of the present invention.

As shown in FIG. 3, the multiplexer 113 includes a plurality of AND gates $113_1$ to $113_I$ receiving an output signal of a first delay cell, an inverted signal of an output signal of a first time comparator receiving an output signal of a corresponding delay cell, an output signal of a previous first time comparator disposed at the front end of a corresponding first time comparator and then performing an AND operation on the received signals.

When an output signal $Q_n$ of a first time comparator corresponding to the AND gate $113_n$ is 0 and an output signal $Q_{n-1}$ of a previous first time comparator disposed at the front end of the corresponding first time comparator is 1, an output signal of a corresponding first delay cell may be outputted.

In such a configuration the multiplexer 113 may select a signal whose application time is later than the stop signal $IN_2$ and having the smallest time difference with the sop signal among output signals of a plurality of first delay cells $111_1$ to $111_I$ by using output signals of first time comparators $112_1$ to $112_I$.

According to the embodiment of FIG. 3, the multiplexer 113 is configured including a plurality of AND devices. However, according to an embodiment of the present invention, the multiplexer 113 may be configured including another circuit configuration outputting a signal whose application time is later than a stop signal and having the smallest time difference with the stop signal among output signals of first delay cells.

Referring to FIG. 2 again, the second measurement unit 120 may measure a time difference between the stop signal $IN_2$ and a start signal delayed by the first delay line 111 by a second time unit through the second delay line 121 and the third delay line 122.

According to an embodiment of the present invention, the second measurement unit 120 includes the second delay line 121 including a plurality of delay cells $121_1$ to $121_m$ delaying a start signal delayed by the first delay line 111 by a second delay time $T_f$, the third delay line 122 including a plurality of delay cells $122_1$ to $122_n$ delaying the stop signal $IN_2$ by a third delay time Ts, and a plurality of time comparators $123_1$ to $123_{mn}$ outputting a digital signal by comparing the application time of a start signal delayed by the delay cells $121_1$ to $121_m$ of the second delay line 121 with the application time of a stop signal delayed by the delay cells $122_1$ to $122_n$ of the third delay line 122.

As shown in FIG. 2, the second delay line 121 may be configured with a plurality of cascaded delay cells (hereinafter referred to as second delay cells) $121_1$ to $121_m$ having a second delay time $T_f$. As a result, each time a signal inputted to the second delay line 121 passes through the second delay cell, the application time may be delayed by the second delay time $T_f$.

Additionally, the second delay line 122 may be configured with a plurality of cascaded delay cells (hereinafter referred to as third delay cells) $122_1$ to $122_n$ having a third delay time $T_s$. As a result, each time the stop signal $IN_2$ inputted to the third delay line 122 passes through the third delay cell, the application time may be delayed by the third delay time $T_s$.

As shown in FIG. 2, according to an embodiment of the present invention, one second delay cell may match at least two three delay cells. That is, the application time of a signal that one second delay cell outputs may be compared with that of a signal that a plurality of third delay cells output.

For example, a signal that the first second delay cell $121_1$ outputs may be compared with output signals that the second to nth third delay cells $122_2$ to $122_n$ output, in addition to a signal that the first third delay cell $122_1$ outputs.

Such signal multiple comparisons may be implemented by allowing time comparators $123_1$ to $123_{mn}$ (hereinafter referred to as second time comparators) of the second measurement unit 120 to be included to correspond to coordinates on a two-dimensional coordinate plane configured by the second delay line 121 and the third delay line 122.

Referring to FIG. 2, the second delay line 121 and the third delay line 122 may respectively correspond to an x-axis and a y-axis configuring a two-dimensional coordinate plane of the second measurement unit 120. In this case, second delay cells $121_1$ to $121_m$ included in the second delay line 121 may correspond to x-axis coordinates and third delay cells $122_1$ to $122_n$ included in the third delay line may correspond to y-axis coordinates.

Then, the second time comparators $123_1$ to $123_{mn}$ may correspond to (x, y) coordinate points on the two-dimensional coordinate plane of the second measurement unit 120. For example, the first second time comparator $123_1$ may correspond to the coordinates (1,1) on the two-dimensional coordinate plane and the second second time comparator $123_2$ may correspond to the coordinates (2,1).

According to an embodiment of the present invention, when a stop signal delayed by the third delay cells $122_1$ to $122_n$ is inputted before a start signal delayed by the second delay cells $121_1$ to $121_m$, the second time comparators $123_1$ to $123_{mn}$ may output a digital signal whose logic level is 1, and when a stop signal delayed by the third delay cells $122_1$ to $122_n$ is inputted after a start signal delayed by the second delay cells $121_1$ to $121_m$, the second time comparators $123_1$ to $123_{mn}$ may output a digital signal whose logic level is 0.

For example, as shown in FIG. 2, the second time comparators $123_1$ to $113_{mn}$ may be D flip-flops receiving a stop signal delayed by the third delay cells $122_1$ to $122_n$ as data D and receiving a start signal delayed by the second delay cells $121_1$ to $121_m$ as a clock Clk.

The second time comparators $123_1$ to $123_{mn}$ shown in FIG. 2 may be configured to output a digital signal whose logic level is 1 when a delayed stop signal is applied before a delayed start signal and output a digital signal whose logic level is 0 when a delayed stop signal is applied after a delayed start signal. However, according to an embodiment of the present invention, the second time comparators $123_1$ to $123_{mn}$ may be configured to output a digital signal whose logic level is 0 when a delayed stop signal is applied before a delayed start signal and output a digital signal whose logic level is 1 when a delayed stop signal is applied after a delayed start signal.

As mentioned above, the TDC 100 according to an embodiment of the present invention is configured including the first measurement unit 110 including the first delay line 111 and the second measurement unit 120 with a two dimension by using the second delay line 121 and the third delay line 122, so that hardware required to obtain the predetermined number of output bits, for example, the number of delay cells, is reduced greatly.

Figure 4:
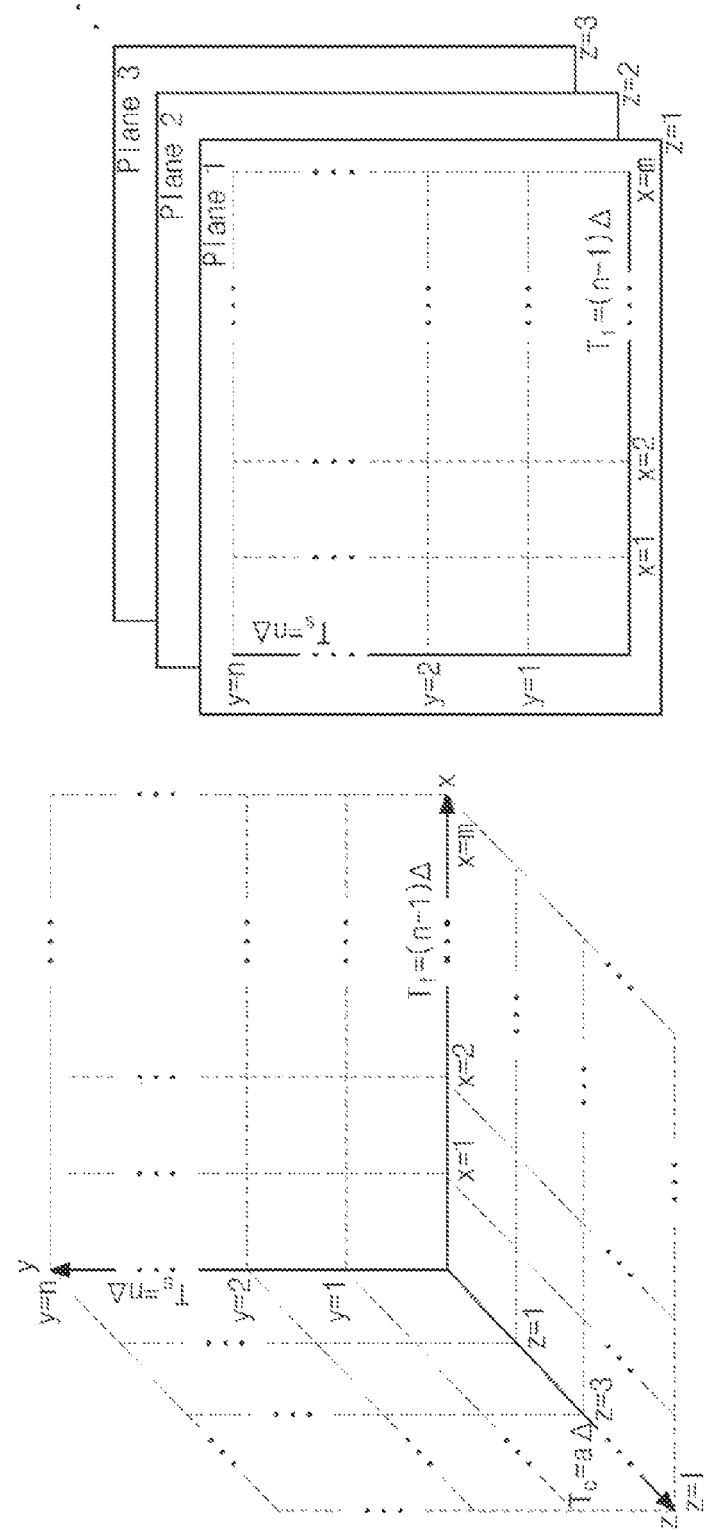
FIG. 4 is a view illustrating the concept of a TDC according to an embodiment of the present invention.

FIG. 4 is a view illustrating the concept of a TDC according to an embodiment of the present invention.

The TDC 100 may configure a time to digital conversion space by using the first to third delay lines 111, 121, and 122.

Referring to FIG. 4, the first delay line 111 may correspond to the z-axis of the time to digital conversion space; the second delay line 121 may correspond to the x-axis; and the third delay line 122 may correspond to the y-axis. Additionally, the coordinate of each axis may correspond to a delay cell included in each delay line.

In the TDC 100, when the start signal $IN_1$ and the stop signal $IN_2$ are inputted, the first measurement unit 110 may delay the start signal $IN_1$ by the first delay time $T_c$ along the first delay line 111 and may measure a time difference between the start signal $IN_1$ and the stop signal $IN_2$ as the first time unit $T_c$.

As a result, the z-axis corresponding to a time difference between the start signal $IN_1$ and the stop signal $IN_2$ may be determined as shown in FIG. 4. For example, when a start signal delayed by the second first delay cell $111_2$ is applied later than a stop signal, the z-axis coordinate may be determined as z=2 corresponding to the second first delay cell $111_2$.

In such a way, when the z-axis coordinate is determined, a plane vertical to the z-axis is determined and the TDC 100 may determine two-dimensional coordinates (x, y) corresponding to a time difference between the start signal $IN_1$ and the stop signal $IN_2$ on the plane through the second measurement unit 120.

Figure 5:
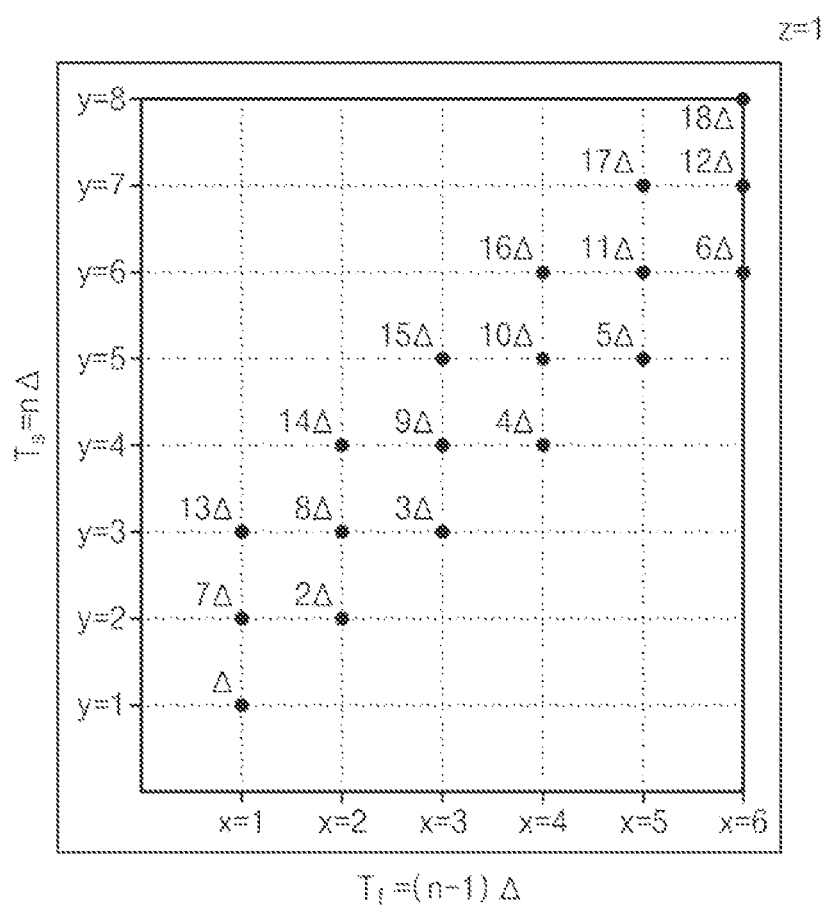
FIG. 5 is a view illustrating a configuration of a second measurement unit according to an embodiment of the present invention.

FIG. 5 is a view illustrating a configuration of a second measurement unit 120 according to an embodiment of the present invention.

As mentioned above, the second measurement unit 120 may correspond to a two-dimensional plane in a time to digital conversion space. In the plane shown in FIG. 5 as a plane corresponding to z=1, coordinates on the plane may correspond to the second time comparators $123_1$ to $123_{mn}$ comparing a stop signal delayed by the third delay line 122 and a start signal delayed by the second delay line 121.

According to an embodiment of the present invention, the third delay cells $122_1$ to $122_n$ corresponding to y-axis coordinates may delay the stop signal $IN_2$ by a third delay time Ts and the second delay cells $121_1$ to $121m$ corresponding to x-axis coordinates may delay a start signal by a second delay time $T_f$. The third delay time $T_s$ may be greater than the second delay time $T_f$ (that is, $T_s > T_f$). That is, the stop signal $IN_2$ may be delayed longer than a start signal delayed by the first delay line 111 in the second measurement unit 120.

According to an embodiment of the present invention, the first measurement unit 110 may measure a time difference between a start signal $IN_1$ and a stop signal $IN_2$ by a first time unit and the second measurement unit 120 may measure a time difference between a stop signal $IN_2$ and a start signal delayed by the first delay line 111 by a second time unit.

Here, the first time unit may correspond to the first delay time $T_c$, that is, a delay time of the first delay cells $111_1$ to $111_l$ and the second time unit may correspond to a time difference $T_s - T_f$ between the third delay time $T_s$ and the second delay time $T_f$.

Additionally, the first time unit may be greater than the second time unit. That is, the first measurement unit 110 may measure a time difference between two signals by a time unit greater than that of the second measurement unit 120.

As shown in FIGS. 4 and 5, the first delay time $T_c$ is a Δ, the third delay time $T_s$ is nΔ, and the second delay time $T_f$ is set to (n−1)Δ, the first measurement unit 110 may measure a time difference between a start signal and a stop signal by a time unit of a Δ and the second measurement unit 120 may measure a time difference between a stop signal and a delayed start signal by a time unit of nΔ−(n−1)Δ=Δ.

For example, as shown in FIG. 5, the first second time comparator $123_1$ corresponding to the coordinate (1, 1) may compare the application times of a stop signal delayed by nΔ and a start signal delayed by (n−1)Δ and the second time comparator $123_{m+2}$ may compare the applications times of a stop signal delayed by 2nΔ and a start signal delayed by 2(n−1)Δ. In such a manner, the second measurement unit 120 may measure a time difference between two signals by a time unit of Δ.

Additionally, the second delay line 121 and the third delay line 122 in the second measurement unit 120 are configured to form a two-dimensional coordinate plane, that is, one second delay cell in the second delay line 121 is configured to match at least two three delay cells included in the third delay line 122. Therefore, according to an embodiment of the present invention, the more number of output bits may be implemented with the less number of delay cells.

For example, when a 10-bit TDC is implemented, a vernier TDC configured with two delay lines requires a total of 2048 delay cells. However, the TDC 100 according to an embodiment of the present invention may output a 10-bit digital code only with 70 to 80 delay cells. As a result, a chip area and power consumption for a TDC are more greatly reduced than before.

Furthermore, according to an embodiment of the present invention, since the length of a delay line required for obtaining the predetermined number of output buts becomes shorter, the linearity deterioration of a TDC due to an unexpected delay in a delay line may be prevented.

Figure 6:
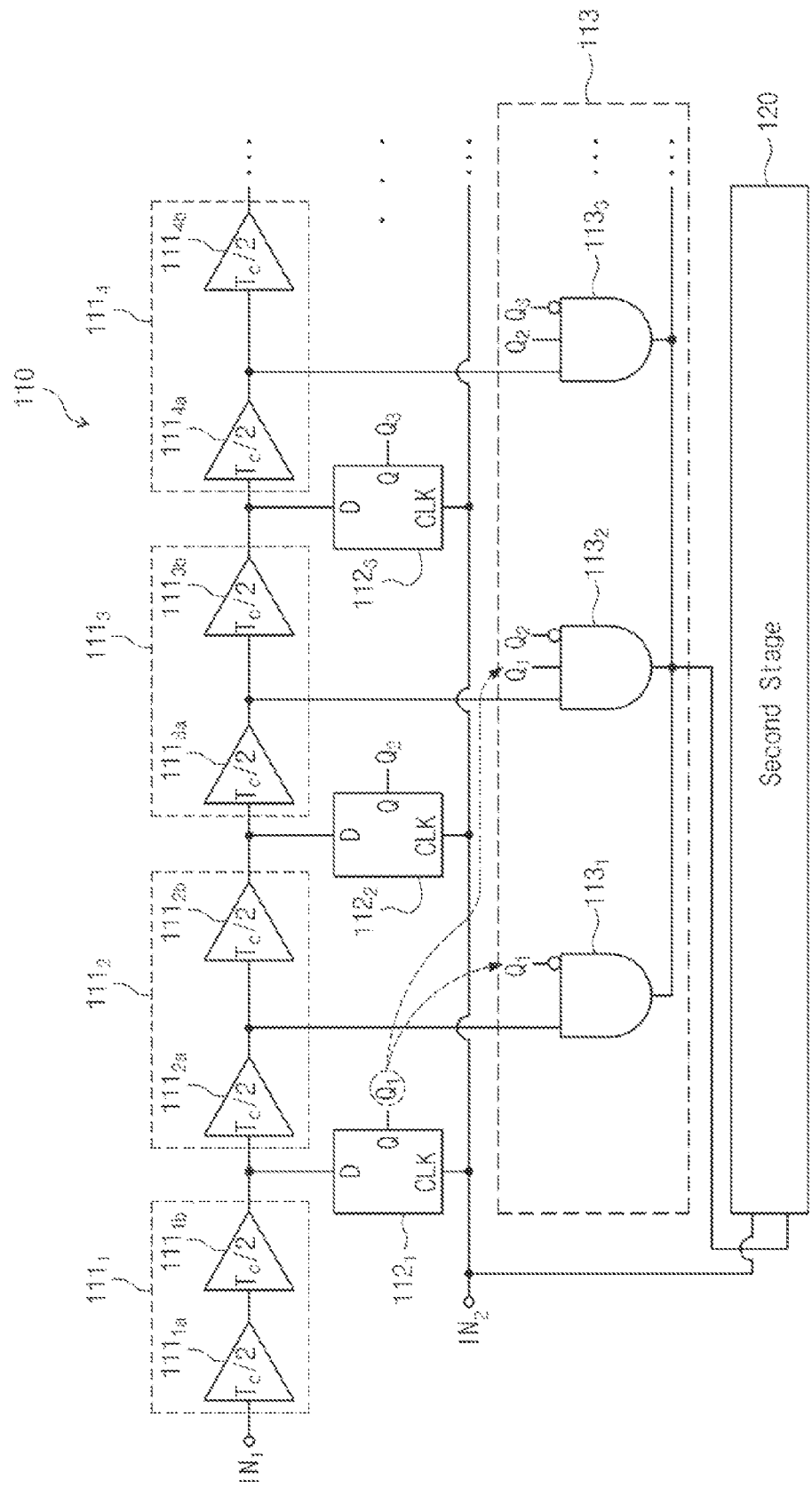
FIG. 6 is a circuit diagram illustrating a multiplexer according to another embodiment of the present invention.

FIG. 6 is a circuit diagram illustrating a multiplexer 113 according to another embodiment of the present invention.

As shown in FIG. 6, first delay cells $111_1$ to $111_l$ include first sub delay cells $111_a$ to $111_{Ia}$ and second sub delay cells $111_b$ to $111_{Ib}$.

The first sub delay cells $111_{1n}$ to $111_{Ia}$ may delay a start signal $IN_1$ by a portion of a first time unit $T_c$. The second sub delay cells $111_b$ to $111_{Ib}$ may further delay a start signal delayed by the first sub delay cells $111_{1a}$ to $111_{Ia}$ by the by the remaining portion of the first time unit $T_c$.

According to an embodiment of the present invention, as shown in FIG. 6, the first sub delay cells $111_{1a}$ to $111_I$ and the second sub delay cells $111_b$ to $111_{Ib}$ may delay a signal by the half ($T_c/2$) of a first time unit.

Additionally, as shown in FIG. 6, the multiplexer 113 includes a plurality of AND gates $113_1$ to $113_I$ receiving an output signal of a first delay cell, an inverted signal of an output signal $Q_n$ of a first time comparator receiving a start signal inputted to a corresponding first sub delay cell, and an output signal $Q_{n-1}$ of a previous first time comparator disposed at the front end of a corresponding first time comparator and then performing an AND operation on the received signals.

A configuration of such first and second sub delay cells and a multiplexer may prevent the linear deterioration of the TDC 100 due to an unexpected delay in a delay line or a multiplexer.

Referring to FIG. 1 again, the output unit 130 may output a final time difference between a start signal $IN_1$ and a stop signal $IN_2$ as a digital code on the basis of a measurement result of the first measurement unit 110 and the second measurement unit 120.

According to an embodiment of the present invention, the first measurement unit 110 may include a calculation unit calculating the final time difference by subtracting a time difference between the stop signal $IN_2$ measured by the second measurement unit 120 and a start signal delayed by the first delay line 111 from a time difference between the start signal $IN_1$ and the stop signal $IN_2$ measured by the first measurement unit 110.

Hereinafter, in describing an operation of the TDC 100 according to an embodiment of the present invention, a process for calculating a final time difference between a start signal and a stop signal is described.

Figure 7:
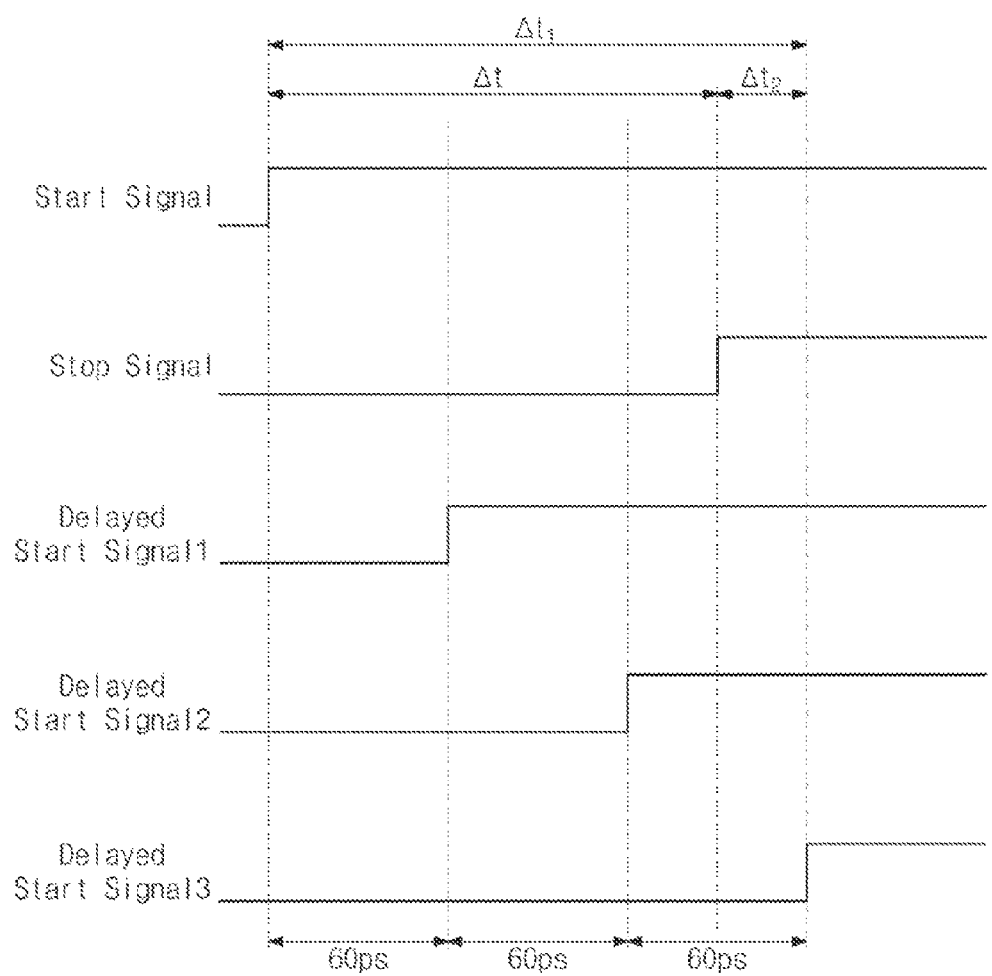
FIG. 7 is a timing diagram illustrating an operation performed by a first measurement unit according to an embodiment of the present invention.

FIG. 7 is a timing diagram illustrating an operation performed by the first measurement unit 110 of the TDC 100 according to an embodiment of the present invention.

In the embodiment of FIG. 7, it is assumed that first delay cells $111_1$ to $111_l$ delay a signal by 60 ps and then output it and a time difference $\Delta t$ between a start signal and a stop signal is 145 ps.

Once a start signal $IN_1$ and a stop signal $IN_2$ are inputted to the first measurement unit 110, the first delay line 111 may delay the start signal $IN_1$ by a first delay time $T_c$, that is, 60 ps, and may then output it.

Referring to FIG. 7, the first first delay cell $111_1$ included in the first delay line 111 may output a delayed start signal 1 obtained by delaying the start signal $IN_1$ by 60 ps; the second first delay cell $111_2$ may output a delayed start signal 2 obtained by delaying the delayed start signal 1 by 60 ps; and the third first delay cell $111_3$ may output a delayed start signal 3 obtained by delaying the delayed start signal 2 by 60 ps.

In this embodiment, since a stop signal $IN_2$ is applied later than the start signal $IN_1$ by 145 ps, the first first time comparator $112_1$ and the second first time comparator $112_2$ included in the first measurement unit 110 may output a digital signal having a logic level of 1 and the third first time comparator $112_3$ to the Ith first time comparator $112_I$ may output a digital signal having a logic level of 0.

As a result, the first measurement unit 110 may provide $\Delta t1=180$ ps as a result obtained by measuring a time difference between the start signal $IN_1$ and the stop signal $IN_2$.

Additionally, the multiplexer 113 may select a signal whose application time is later than the stop signal $IN_2$ and having the smallest time difference with the stop signal $IN_2$, that is, the delayed start signal 3, from output signals of the first delay cells $111_1$ to $111_I$, and may then provide the selected signal to the second measurement unit 120.

Figure 8:
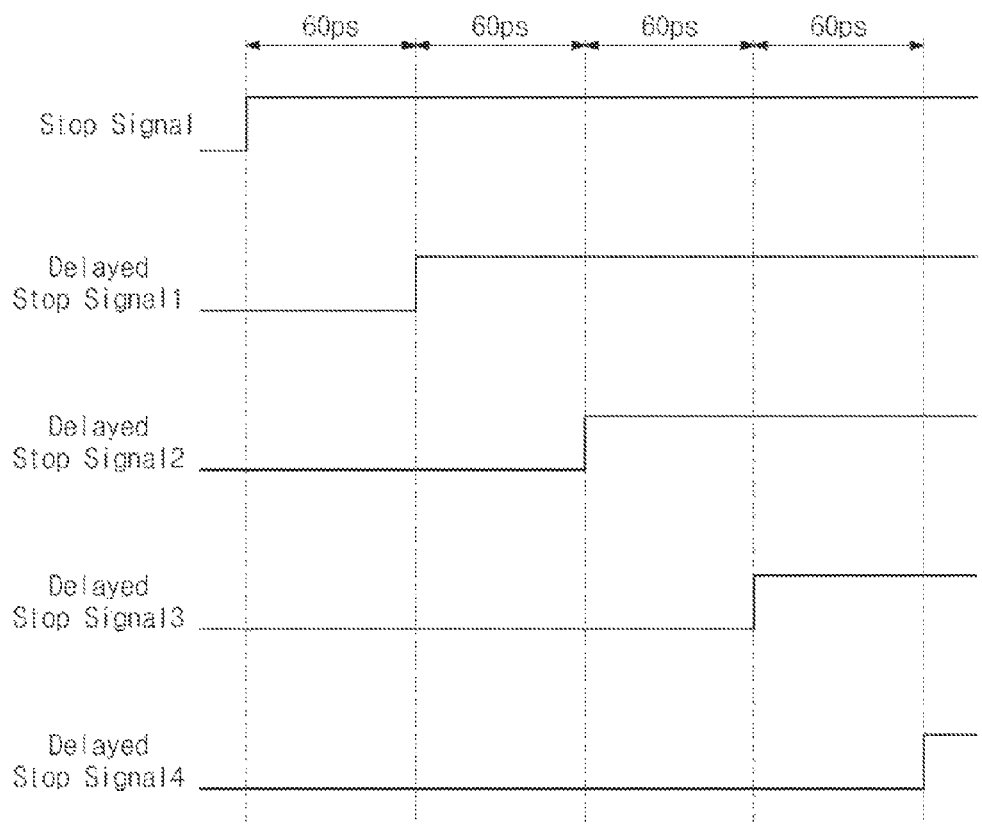
FIGS. 8 and 9 are timing diagrams respectively illustrating a stop signal delayed by a third delay line and a start signal delayed by a second delay line according to an embodiment of the present invention.
Figure 9:
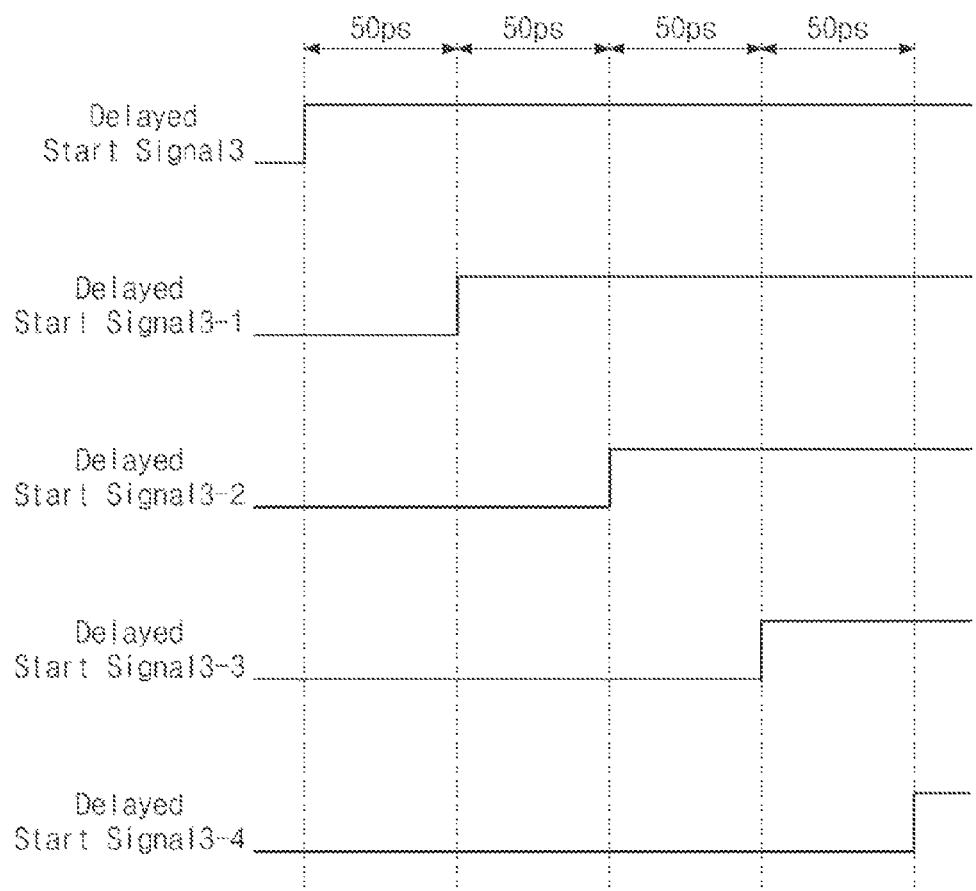
Figure 10:
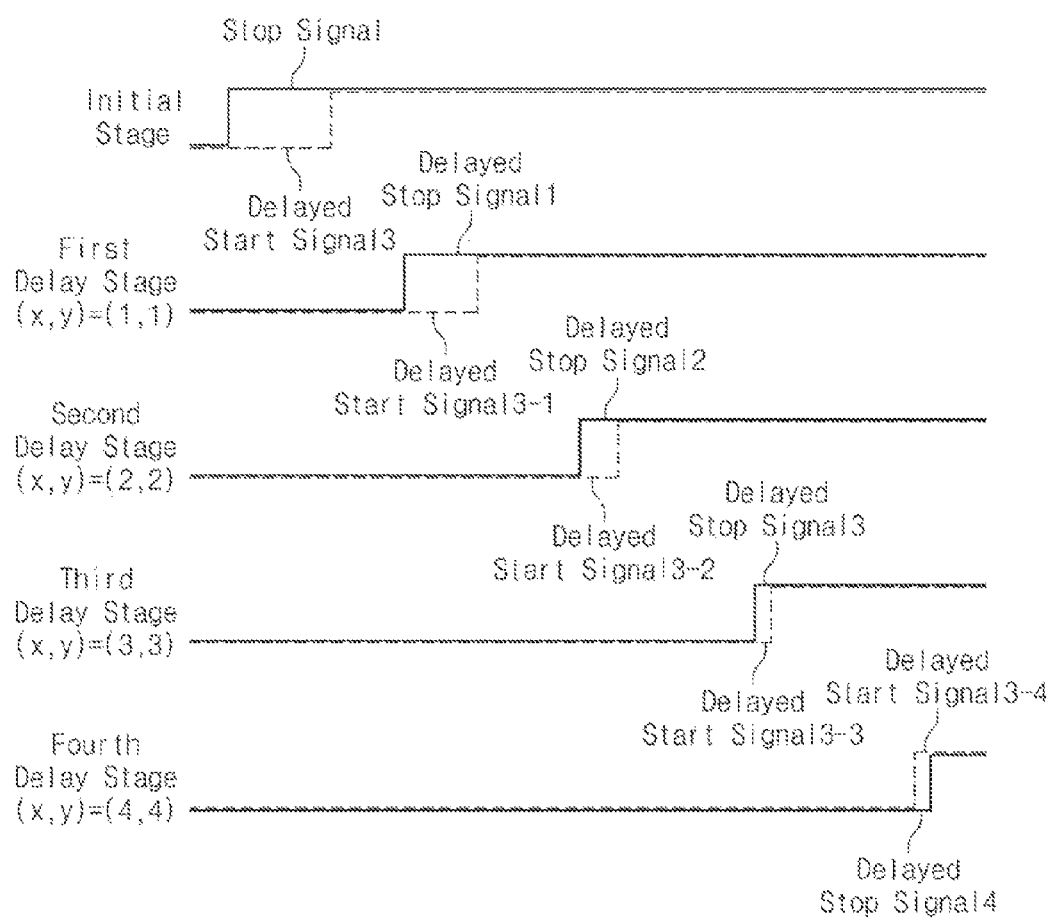
FIG. 10 is a timing diagram illustrating an operation performed by a second measurement unit according to an embodiment of the present invention.

FIG. 8 is a timing diagram illustrating a stop signal delayed by the third delay line 122 according to an embodiment of the present invention. FIG. 9 is a timing diagram illustrating a start signal delayed by the second delay line 121 according to an embodiment of the present invention. FIG. 10 is a timing diagram illustrating an operation performed by the second measurement unit 120 according to an embodiment of the present invention.

In the embodiments of FIGS. 8 to 10, it is assumed that third delay cells $122_1$ to $122_n$ delay a signal by 60 ps and then output it and second delay cells $121_1$ to $121_m$ delay a signal by 50 ps and then output it.

Once a stop signal $IN_2$ and a delayed start signal 3 are inputted to the second measurement unit 120, the third delay line 122 may delay the stop signal $IN_2$ by a third delay time $T_s$, that is, 60 ps, and may then output it.

Referring to FIG. 8, the first third delay cell $122_1$ included in the third delay line 122 may output a delayed stop signal 1 obtained by delaying the stop signal $IN_2$ by 60 ps; the second third delay cell $122_2$ may output a delayed stop signal 2 obtained by delaying the delayed stop signal 1 by 60 ps; the third delay cell $122_3$ may output a delayed stop signal 3 obtained by delaying the delayed stop signal 2 by 60 ps; and the fourth third delay cell $122_4$ may output a delayed stop signal 4 obtained by delaying the delayed stop signal 3 by 60 ps.

Additionally, referring to FIG. 9, the first second delay cell $121_1$ included in the second delay line 121 may output a delayed start signal 3-1 obtained by delaying the delayed start signal 3 by 50 ps; the second delay cell $121_2$ may output a delayed start signal 3-2 obtained by delaying the delayed start signal 3-1 by 50 ps; the third second delay cell $121_3$ may output a delayed start signal 3-3 obtained by delaying the delayed start signal 3-2 by 50 ps; and the fourth second delay cell $121_4$ may output a delayed start signal 3-4 obtained by delaying the delayed start signal 3-3 by 50 ps.

In this embodiment, since the delayed start signal 3 is applied later than the stop signal $IN_2$ by 35 ps, as shown in FIG. 10, as the stop signal $IN_2$ becomes delayed by 240 ps and the delayed start signal 3 becomes delayed by 200 ps, an application time reversal between a stop signal and a start signal may occur.

Accordingly, the first second time comparator $123_1$, the m+2th second time comparator $123_{m+2}$, and the 2m+3th second time comparator $123_{2m+3}$ included in the second measurement unit 120 may output a digital signal having a logic level of 1 and the 3m+4th second time comparator $123_{3m+4}$ may output a digital signal having a logic level of 0.

As a result, the second measurement unit 120 may provide $\Delta t2=40$ ps as a result obtained by measuring a time difference between the stop signal $IN_2$ and the delayed start signal 3.

The output unit 130 may calculate a final time difference between the start signal $IN_1$ and the stop signal $IN_2$ on the basis of the measurement result $\Delta t1$ of the first measurement unit 110 and the measurement result $\Delta t2$ of the second measurement unit 120.

For example, a calculation unit included in the output unit 130 may calculate the final time difference $\Delta t1-\Delta t2$ by subtracting the time difference $\Delta t2$ measured by the second measurement unit 120 from the time difference $\Delta t1$ measured by the second measurement unit 120. According to the embodiments of FIGS. 7 to 10, the final time difference may be calculated as 180−40=140 ps.

The output unit 130 may output the calculated final time difference as a digital code.

According to an embodiment of the present invention, the output unit 130 may include a thermometer-binary encoder converting a thermometer code configured with a digital signal outputted from first and second time comparators into a binary code.

Figure 11:
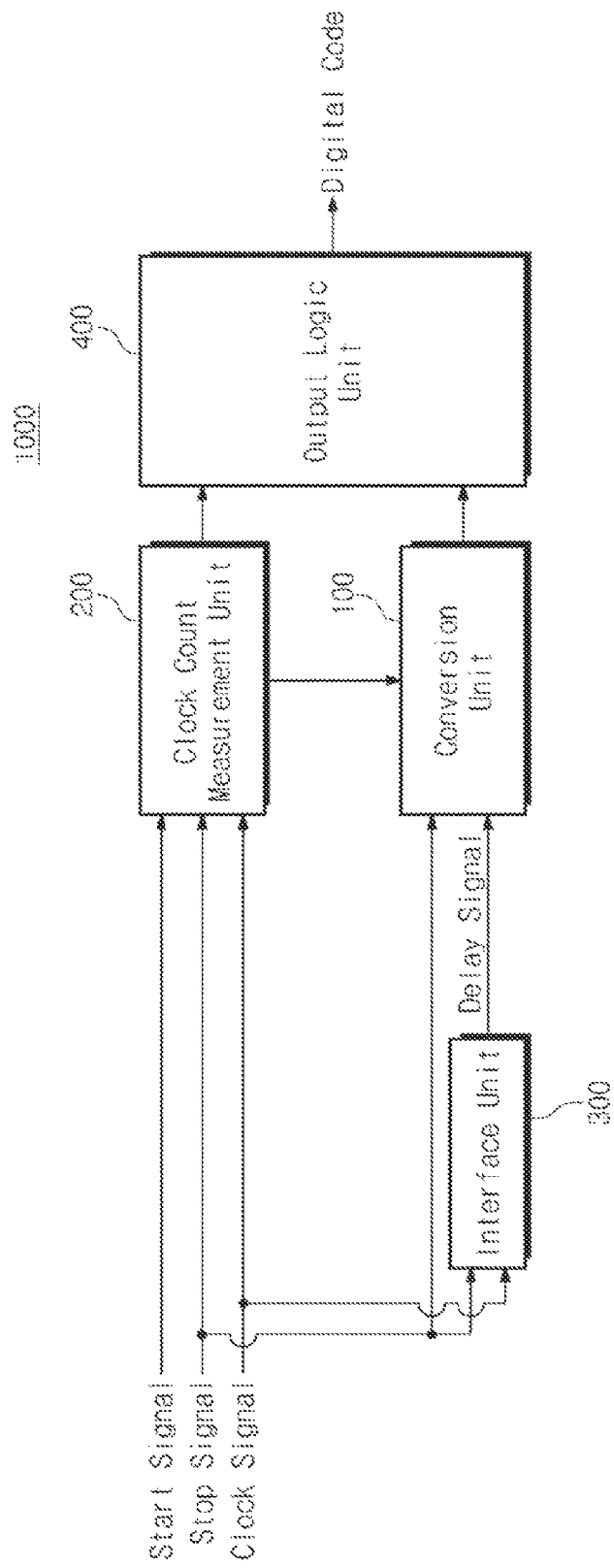
FIG. 11 is a block diagram illustrating a TDC according to another embodiment of the present invention.

FIG. 11 is a block diagram illustrating a TDC according to another embodiment of the present invention.

As shown in FIG. 11, the TDC 1000 includes a conversion unit 100, a clock count measurement unit 200, an interface unit 300, and an output logic unit 400.

The clock count measurement unit 200 may measure the number of clocks between a start signal and a stop signal. The interface unit 300 may output a delay signal by delaying the stop signal. The conversion unit 100 may measure a time difference between the stop signal and the delay signal and may then convert the measured time difference into a digital code. The output logic unit 400 may output a time difference between the start signal and the stop signal as a digital code on the basis of the number of clocks and the time difference.

Figure 12:
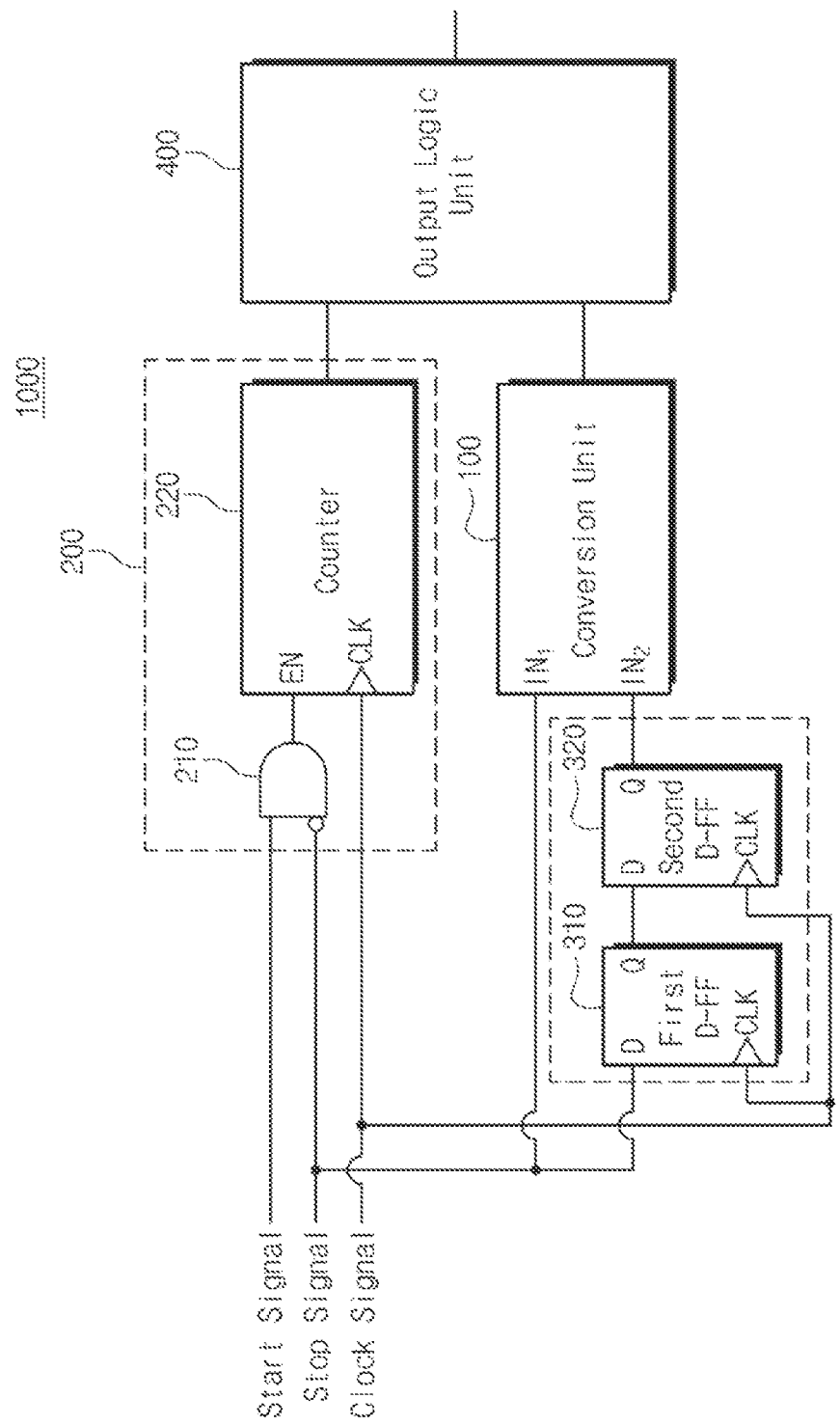
FIG. 12 is a circuit diagram illustrating a TDC according to another embodiment of the present invention.

FIG. 12 is a circuit diagram illustrating a TDC 1000 according to another embodiment of the present invention.

As shown in FIG. 12, according to an embodiment of the present invention, the clock count measurement unit 200 includes an AND gate 210 and a counter 220.

The AND gate 210 may generate an enable signal by performing an AND operation on a start signal and an inverted signal of a stop signal. The counter 220 may count the number of clocks inputted while the enable signal is applied by receiving the enable signal and a clock signal.

In such a way, the clock count measurement unit 200 may measure the number of clocks between a start signal and a stop signal by using the AND gate 210 and the counter 220 but a configuration of the clock count measurement unit is not limited thereto. The clock count measurement unit 200 may have another configuration measuring the number of clocks between a start signal and a stop signal.

Referring to FIG. 12 again, the interface unit 300 includes a first D flip-flop 310 receiving a stop signal as data D and receiving a clock signal as a clock CLK and a second D flip-flop 320 receiving an output signal of the first D flip-flop 310 as data D and receiving the clock signal as a clock CLK to output a delay signal.

The interface unit 300 shown in FIG. 12 delays a stop signal by using two D flip-flops but the number of D flip-flops is not limited thereto. That is, there may one or at least three D flip-flops. According to an embodiment of the present invention, the interface unit 300 may have another configuration delaying a stop signal.

The conversion unit 100 may measure a time difference between the stop signal and the delay signal and may then convert the measured time difference into a digital code.

According to an embodiment of the present invention, the conversion unit 100 may have the same configuration as one described with reference to FIGS. 1 to 10 but the present invention is not limited thereto.

If the conversion unit 100 has the same configuration as a TDC according to an embodiment of the present invention, it may include a first measurement unit 110, a second measurement unit 120, and an output unit 130. However, unlike a TDC measuring a time difference between a start signal and a stop signal according to an embodiment of the present invention, the conversion unit 100 measures a time difference between a stop signal and a delay signal delaying the stop signal.

In this case, the first measurement unit 110 in the conversion unit 100 measures a time difference between a stop signal and a delay signal by a first time unit by using a first delay line. The second measurement unit 120 measures a time difference between a delay signal and a stop signal delayed by the first delay line by a second time unit by using a second delay line and a third delay line. The output unit 130 may output a final time difference between a stop signal and a delay signal as a digital code on the basis of measurement results of the first measurement unit 110 and the second measurement unit 120.

Referring to FIG. 12 again, the output logic unit 400 may output a digital code corresponding to a time difference between a start signal and a stop signal by adding the number of D flip-flops (for example, two in FIG. 12) included in the interface unit 300 to the number of clocks measured by the clock count measurement unit 200 and subtracting a digital code corresponding to a time difference between a stop signal and a delay signal measured by the conversion unit 100.

Figure 13:
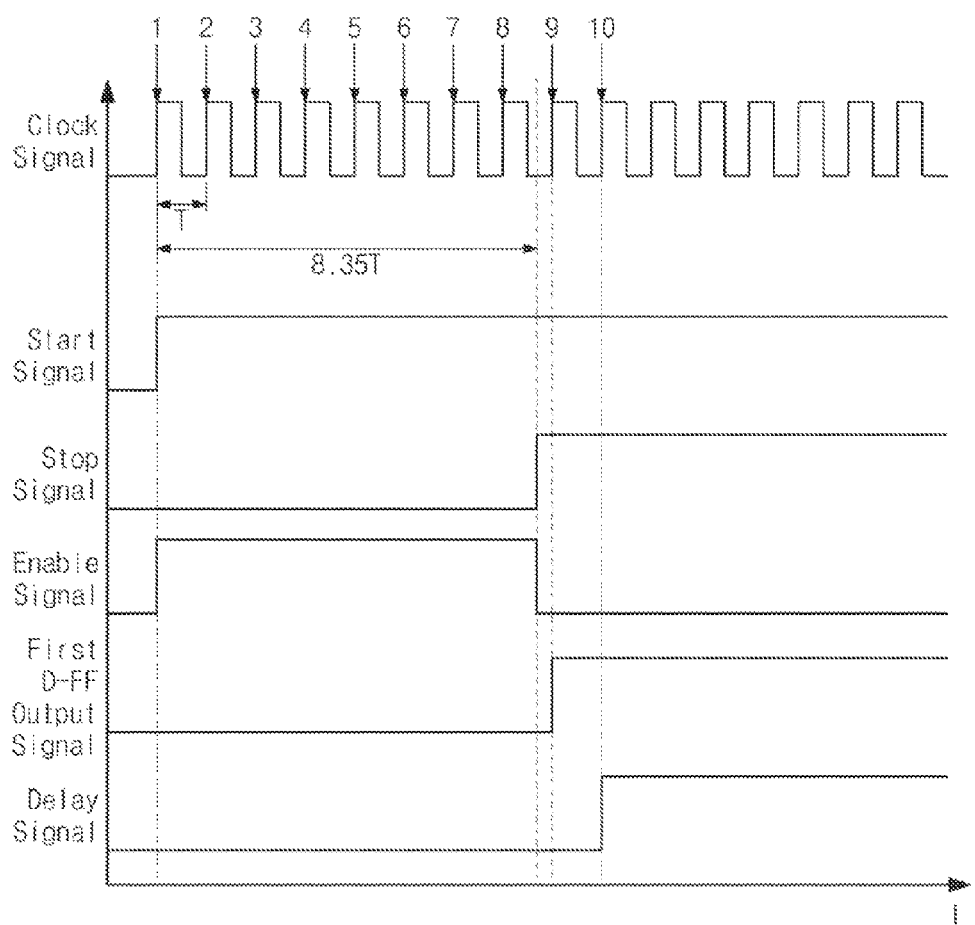
FIG. 13 is a timing diagram illustrating an operation of a TDC 1000 according to another embodiment of the present invention.

FIG. 13 is a timing diagram illustrating an operation of a TDC 1000 according to another embodiment of the present invention. In the embodiment of FIG. 13, it is assumed that the period of a clock signal is T and a time difference between a start signal and a stop signal is 8.35T.

Referring to FIG. 13, the AND gate 210 may generate an enable signal by performing an AND operation on a start signal and an inverted signal of a stop signal. Accordingly, the enable signal rises at the rising edge of a start signal and falls at the rising edge of a stop signal.

As receiving an enable signal and a clock signal, the counter 220 may count the number of clocks inputted while the enable signal is applied. In the embodiment of FIG. 13, the counter 220 outputs a bit corresponding to 8 by increasing an output value by 1 at each rising edge of a clock signal.

The first D flip-flop 310 receives a stop signal as data D and a clock signal as a clock CLK and once a clock is applied, outputs a signal inputted as data from Q. Referring to FIG. 13, after the eighth clock is applied, the first D flip-flop 310 receives a stop signal as data D and outputs a signal when the ninth clock is applied.

The second D flip-flop 320 receives an output signal of the first D flip-flop 310 as data D and a clock signal as a clock CLK and then outputs a delay signal. Referring to FIG. 13, after the ninth clock is applied, the second D flip-flop 320 receives an output signal of the first D flip-flop 310 as data D and outputs a delay signal when the tenth clock is applied.

The conversion unit 100 may output a digital code corresponding to a time difference between a stop signal and a delay signal. Referring to FIG. 13, the conversion unit 100 may output a digital code corresponding to 1.65T, that is, a time difference between a stop signal and a delay signal.

The output logic unit 400 adds a bit corresponding to the number of D flip-flops included in the interface unit 300 to a bit corresponding to the number of clocks outputted from the counter 220 and then subtracts a digital code corresponding to a time difference between a stop signal outputted from the conversion unit 100 and a delay signal. For example, referring to FIG. 13, the output logic unit 400 adds 2 corresponding to the number of D flip-flops 310 and 320, to 8 corresponding to the number of clocks between a start signal and a stop signal to calculate 10 and subtracts 1.65 corresponding to a time difference between a stop signal and a delay signal from 10 to output 8.35.

In such a way, the TDC 1000 according to another embodiment of the present invention further uses a counter in addition to a converter, so that a wider time range may be measured with less hardware compared to when only the converter is used.

A TDC including two measurement units measuring a time difference between two signals by using different time units is described above. The TDC configures a three-dimensional time to digital conversion space with three delay lines used for two measurement units so that the number of delay cells required to implement the TDC may be reduced greatly. Additionally, a chip area and power consumption for a TDC may be reduced and the linearity deterioration due to an unexpected delay occurring in a TDC may be prevented.

According to an embodiment of the present invention, the larger number of output bits may be obtained with less hardware.

According to an embodiment of the present invention, the increase of a chip area and power consumption due to the increase in the number of output bits may be minimized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A time to digital converter comprising:
   a first measurement unit measuring a time difference between a start signal and a stop signal by a first time unit by using a first delay line;
   a second measurement unit measuring a time difference between the stop signal and the start signal delayed by the first delay line by a second time unit by using a second delay line and a third delay line, and comparing an output signal of one delay cell included in the second delay line with an output signal of at least two delay cells included in the third delay line; and
   an output unit outputting a final time difference between the start signal and the stop signal as a digital code on the basis of measurement results of the first measurement unit and the second measurement unit,
   wherein the output unit comprises a calculation unit subtracting a time difference between a stop signal measured by the second measurement unit and a start signal delayed by a first delay line from a time difference between a start signal and a stop signal measured by the first measurement unit to calculate the final time difference.

2. A time to digital converter comprising:
   a first measurement unit measuring a time difference between a start signal and a stop signal by a first time unit by using a first delay line;
   a second measurement unit measuring a time difference between the stop signal and the start signal delayed by the first delay line by a second time unit by using a second delay line and a third delay line, and comparing an output signal of one delay cell included in the second delay line with an output signal of at least two delay cells included in the third delay line; and
   an output unit outputting a final time difference between the start signal and the stop signal as a digital code on the basis of measurement results of the first measurement unit and the second measurement unit,
   wherein the first measurement unit comprises:
   a first delay line receiving the start signal and including a plurality of cascaded delay cells delaying an input signal by the first time unit;
   a plurality of time comparators outputting a digital signal by comparing an application time of the start signal delayed by the delay cell of the first delay line with an application time of the stop signal; and
   a multiplexer selecting one of the start signals delayed by the plurality of delay cells according to a digital signal outputted from at least one of the plurality of time comparators.

3. The converter of claim 2, wherein at least one of the plurality of time comparators outputs a digital signal having a logic level of 1 when the start signal delayed by the delay cell is received before the stop signal, and outputs a digital signal having a logic level of 0 when the start signal delayed by the delay cell is received after the stop signal.

4. The converter of claim 3, wherein at least one of the plurality of time comparators is a D flip-flop receiving the start signal delayed by the delay cell as data and receiving the stop signal as a clock.

5. The converter of claim 3, wherein the multiplexer selects a signal applied first from delayed start signals received by a time comparator outputting a digital signal having a logic level of 0, and then provides the selected signal to the second measurement unit.

6. The converter of claim 5, wherein the multiplexer comprises a plurality of AND gates receiving an output signal of a delay cell, an inverted signal of an output signal of a time comparator receiving an output signal of a corresponding delay cell, and an output signal of a previous time comparator disposed at a front end of a corresponding time comparator and performing an AND operation on the received signals.

7. A time to digital converter comprising:
   a first measurement unit measuring a time difference between a start signal and a stop signal by a first time unit by using a first delay line;
   a second measurement unit measuring a time difference between the stop signal and the start signal delayed by the first delay line by a second time unit by using a second delay line and a third delay line, and comparing an output signal of one delay cell included in the second delay line with an output signal of at least two delay cells included in the third delay line; and
   an output unit outputting a final time difference between the start signal and the stop signal as a digital code on the basis of measurement results of the first measurement unit and the second measurement unit,
   wherein the second measurement unit comprises:
   a second delay line receiving the start signal delayed by the first delay line and including a plurality of cascaded delay cells delaying an input signal by a second delay time;
   a third delay line receiving the stop signal and including a plurality of cascaded delay cells delaying an input signal by a third delay time; and
   a plurality of time comparators outputting a digital signal by comparing an application time of a start signal delayed by a delay cell of the second delay line with an application time of a stop signal delayed by a delay cell of the third delay line.

8. The converter of claim 7, wherein the second time unit is a time difference between the third delay time and the second delay time.

9. The converter of claim 1, wherein the first time unit is greater than the second time unit.

10. The converter of claim 7, wherein the plurality of time comparators are configured to compare one delayed start signal outputted from the second delay line with a plurality of delayed stop signals outputted from the third delay line.

11. The converter of claim 7, wherein at least one of the plurality of time comparators outputs a digital signal having a logic level of 1 when the stop signal delayed by the delay cell of the third delay line is received before the start signal delayed by the delay cell of the second delay line, and outputs a digital signal having a logic level of 0 when the stop signal delayed by the delay cell of the third delay line is received after the start signal delayed by the delay cell of the second delay line.

12. The converter of claim 11, wherein at least one of the plurality of time comparators is a D flip-flop receiving the stop signal delayed by the delay cell of the third delay line as data and receiving the start signal delayed by the delay cell of the second delay line as a clock.

13. The converter of claim 2, wherein the delay cell comprises:
a first sub delay cell delaying the start signal by a portion of the first time unit; and
a second sub delay cell delaying a start signal delayed by the first sub delay cell by the remaining of the first time unit.

14. The converter of claim 13, wherein the multiplexer comprises a plurality of AND gates receiving an output signal of a first sub delay cell, an inverted signal of an output signal of a time comparator receiving a start signal inputted to a corresponding first sub delay cell, and an output signal of a previous time comparator disposed at a front end of a corresponding time comparator and performing an AND operation on the received signals.

15. A time to digital converter comprises:
a first delay line including a plurality of cascaded first delay cells, receiving a start signal, and delaying the start signal by a first delay time and outputting the delayed signal each time the start signal passes through the first delay cell;
a plurality of first time comparators receiving an output signal and a stop signal of the first delay, and comparing application times of the two signals;
a multiplexer selecting a signal whose application time is later than that of the stop signal and having the smallest time difference with the stop signal from output signals of the plurality of first delay cells by using an output signal of the first time comparator;
a second delay line including a plurality of cascaded second delay cells, receiving the signal selected by the multiplexer, and delaying the signal selected by the multiplexer by a second delay time and outputting the delayed signal each time the signal selected by the multiplexer passes through the second delay cell;
a third delay line including a plurality of cascaded third delay cells, receiving the stop signal, and delaying the stop signal by a third delay time and outputting the delayed signal each time the stop signal passes through the third delay cell; and
a plurality of second time comparators receiving an output signal of the second delay cell and an output signal of the third delay cell, and comparing application times of the two signals,
wherein an output signal of one second delay cell included in the second delay line is compared with an output signal of at least two third delay cells included in the third delay line.

16. The converter of claim 15, wherein at least one of the plurality of first time comparators is a D flip-flop receiving an output signal of the first delay cell as data and receives the stop signal as a clock; outputting a digital signal having a logic level of 1 when the output signal of the first delay cell is received before the stop signal; and outputting a digital signal having a logic level of 0 when the output signal of the first delay cell is received after the stop signal.

17. The converter of claim 15, wherein the multiplexer comprises a plurality of AND gates receiving an output signal of a first delay cell, an inverted signal of an output signal of a first time comparator receiving an output signal of a corresponding first delay cell, and an output signal of a previous first time comparator disposed at a front end of a corresponding first time comparator and performing an AND operation on the received signals.

18. The converter of claim 15, wherein at least one of the plurality of second time comparators is a D flip-flop receiving an output signal of the third delay cell as data and receiving an output signal of the second delay cell as a clock; outputting a digital signal having a logic level of 1 when the output signal of the third delay cell is received before the output signal of the second delay cell; and outputting a digital signal having a logic level of 0 when the output signal of the third delay cell is received after the output signal of the second delay cell.

19. The converter of claim 15, wherein the first delay cell comprises:
a first sub delay cell delaying the start signal by half of the first delay time; and
a second sub delay cell further delaying the start signal delayed by the first sub delay cell by half of the first delay time.

20. The converter of claim 19, wherein the multiplexer comprises a plurality of AND gates receiving an output signal of a first sub delay cell, an inverted signal of an output signal of a first time comparator receiving a start signal inputted to a corresponding first sub delay cell, and an output signal of a previous first time comparator disposed at a front end of a corresponding first time comparator and performing an AND operation on the received signals.

21. The converter of claim 15, further comprising an output unit outputting a time difference between the start signal and the stop signal as a digital code on the basis of output signals of at least one of the plurality of the first time comparators and the second time comparators.

22. The converter of claim 21, wherein the output unit comprises an encoder converting a thermometer code into a binary code.

23. A time to digital converter comprising:
a clock count measurement unit measuring the number of clocks between a start signal and a stop signal;
an interface unit outputting a delay signal by delaying the stop signal;
a conversion unit measuring a time difference between the stop signal and the delay signal, and converting the measured time difference into a digital code; and
an output logic unit outputting the time difference between the start signal and the stop signal as a digital code on the basis of the number of counts and the time difference,
wherein the conversion unit comprises:
a first measurement unit measuring the time difference between the start signal and the stop signal by a first time unit by using a first delay line;
a second measurement unit measuring a time difference between the delay signal and a stop signal delayed by the first delay line by a second time unit by using a second delay line and a third delay line, wherein one delay cell included in the second delay line matches at least two delay cells included in the third delay line; and
an output unit outputting a final time difference between the stop signal and the delay signal as a digital code on the basis of measurement results of the first measurement unit and the second measurement unit.

24. The converter of claim 23, wherein the clock count measurement unit comprises:
   an AND gate generating an enable signal by performing an AND operation on the start signal and an inverted signal of the stop signal; and
   a counter receiving the enable signal and the clock signal and counting the number of clocks inputted while the enable signal is applied.

25. The converter of claim 23, wherein the interface unit comprises a first D flip-flop receiving the stop signal as data and receiving a clock signal as a clock and a second D flip-flop receiving an output signal of the first D flip-flop as data and receiving the clock signal as a clock to output the delay signal.

26. The converter of claim 23, wherein the output logic unit adds a bit corresponding to the number of D flip-flops included in the interface unit to a bit corresponding to the number of clocks and subtracts a bit corresponding to a time difference between the stop signal and the delay signal.

\* \* \* \* \*